(12) United States Patent
Zhao et al.

(10) Patent No.: US 7,760,509 B1
(45) Date of Patent: Jul. 20, 2010

(54) HEAT DISSIPATION DEVICE HAVING FASTENING STRUCTURE

(75) Inventors: Pin-Qun Zhao, Shenzhen (CN); Dong-Bo Zheng, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/581,168

(22) Filed: Oct. 19, 2009

(30) Foreign Application Priority Data

Jun. 16, 2009 (CN) .................. 2009 1 0303294

(51) Int. Cl.
*H05K 7/20* (2006.01)
(52) U.S. Cl. .................. 361/719; 361/704; 361/720; 165/80.3; 165/185; 174/16.3; 174/252; 257/718; 257/719
(58) Field of Classification Search ............ 361/679.46, 361/679.54, 688, 689, 702–712, 715, 717–722, 361/727, 728, 753, 794, 816, 818; 165/80.2, 165/80.3, 80.4, 80.5, 104.33, 185; 257/706–727; 174/15.1, 16.3, 50 G, 50 R, 252; 248/505, 248/510; 24/297, 457, 458, 453

See application file for complete search history.

(56) References Cited

U.S. PATENT DOCUMENTS

| | | | | |
|---|---|---|---|---|
| 5,109,318 A * | 4/1992 | Funari et al. | ................. | 361/710 |
| 5,237,485 A * | 8/1993 | Cognetti de Martiis et al. | ........................... | 361/712 |
| 6,130,821 A * | 10/2000 | Gerber | ....................... | 361/704 |
| 6,219,905 B1 * | 4/2001 | Bollesen | ....................... | 29/764 |
| 6,795,317 B1 * | 9/2004 | Liu | .............. | 361/704 |
| 7,349,219 B2 * | 3/2008 | Lai et al. | .................... | 361/719 |
| 2007/0165380 A1 * | 7/2007 | Lai et al. | .................... | 361/697 |

* cited by examiner

*Primary Examiner*—Michael V Datskovskiy
(74) *Attorney, Agent, or Firm*—Frank R. Niranjan

(57) ABSTRACT

A heat dissipation device for removing heat from an electronic component mounted on a printed circuit board, includes a heat sink having a bottom for in contact with the electronic component and a plurality of fasteners securing the heat sink onto the printed circuit board. Each fastener includes a first latching member, a second latching member rotatably connected to the first latching member and an operating member rotatably connected to the first latching member and having a pressing part engaging a curved portion defined on a top of the second latching member. The heat sink and the printed circuit board are located between the first and second latching members of each fastener. The operating member is rotated to force the first and the second latching members to rotate toward each other to closely clip the heat sink and printed circuit board together.

14 Claims, 5 Drawing Sheets

HEAT DISSIPATION DEVICE HAVING FASTENING STRUCTURE

BACKGROUND

1. Technical Field

The present disclosure relates to a heat dissipation device, and more particularly to a heat dissipation device having a fastener assembly which can readily and securely attach a heat sink to an electronic component.

2. Description of Related Art

A heat sink is usually placed in thermal contact with electronic components mounted on a printed circuit board, and transfers heat through conduction away from the electronic components so as to prevent overheating of the electronic components. Usually, the heat sink is secured to the electronic components by a clip.

The heat sink comprises a base and a plurality of fins extending from the base. A plurality of grooves is defined between adjacent fins. Two neighboring fins in the middle of the heat sink project a pair of bulges facing to each other. The clip spans across the groove in the middle of the heat sink with a positioning portion received in the middle of the heat sink in a manner such that the positioning portion abuts against the bulges and the base of the heat sink. Two arms, which extend from two ends of the positioning portion, have a pair of hooks engaging with the printed circuit board, thereby securing the heat sink to the printed circuit board.

To secure the heat sink onto the electronic component mounted on the printed circuit board, the two arms at two opposite sides of the heat sink are pressed downwardly to fasten to the printed circuit board. The heat sink is secured on the electronic component by a downward tensile force of the clip from its elastic deformation. The force is exerted on a top of the heat sink. Two through holes or two locking members have to be provided on the printed circuit board at the two opposite sides of the heat sink to respectively engage with two lower ends of the two hooks of the two arms to secure the heat sink. However, in some highly integrated circuit board, the electronic components are closely arranged and adjacent to an edge of the highly integrated circuit board; thus there is no available space around the electronic component on the highly integrated circuit board for accommodating the through holes or the locking members to secure the heat sink.

What is needed, therefore, is a heat dissipation device having an improved fastening structure which can overcome the above problem.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
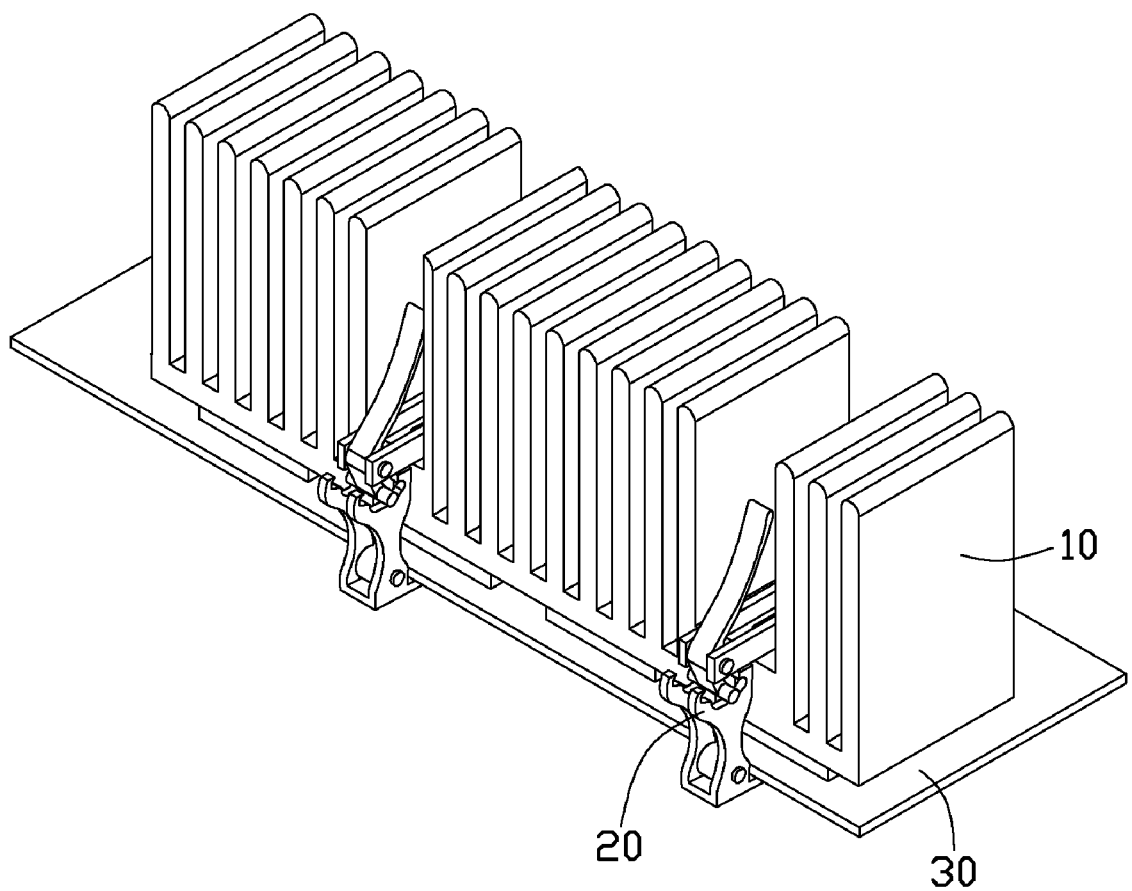
FIG. 1 is an isometric, assembled view of a heat dissipation device in accordance with an embodiment of the present disclosure, mounted on a printed circuit board.
Figure 2:
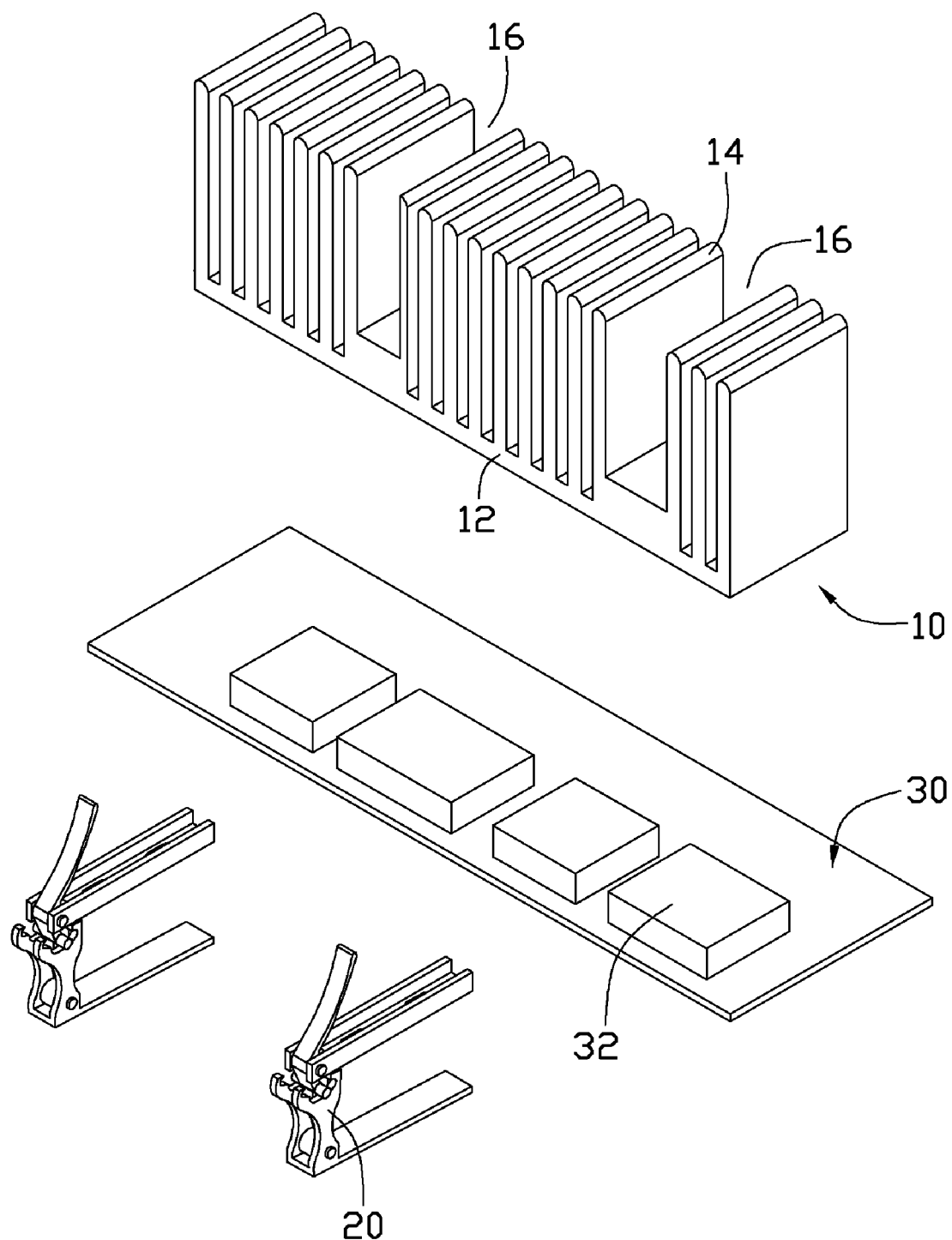
FIG. 2 is an exploded view of the heat dissipation device and the printed circuit board of FIG. 1.

Referring to FIGS. 1-2, a heat dissipation device in accordance with an embodiment of the disclosure is shown. The heat dissipation device includes a heat sink 10 having a bottom for contacting with a plural electronic components 32 mounted on a printed circuit board 30 and two fasteners 20 spanning on the heat sink 10 to secure the heat sink 10 onto the printed circuit board 30 so that the heat sink 10 can have an intimate contact with the electronic components 32.

The heat sink 10 is integrally made of a material with a good heat conductivity such as copper and comprises an elongated base plate 12 having a bottom face for thermally contacting with the electronic components 32, and a plurality of fins 14 integrally extending upwardly and perpendicularly from a top face of the base plate 12. The fins 14 are parallel to two opposite lateral short sides of the heat sink 10 and spaced from each other with a predetermined distance. Two receiving channels 16 are defined in the fins 14 for accommodating the two fasteners 20. Portions of the base plate 12 corresponding to the receiving channels 16 have a thickness larger than other part of the base plate 12, for snugly engaging with the fasteners 20.

Figure 3:
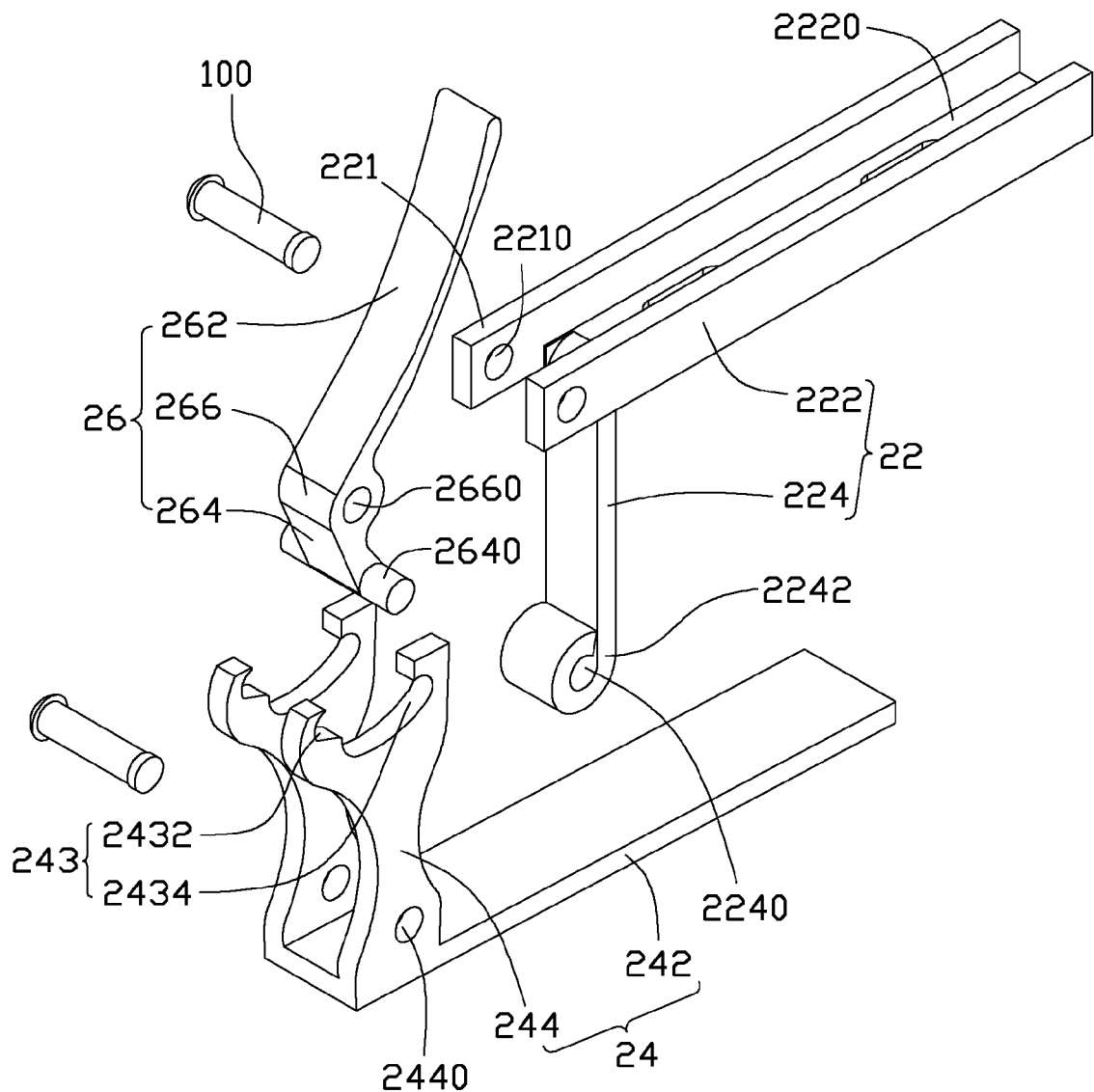
FIG. 3 is an exploded view of a fastener of the heat dissipation device in FIG. 2.

Also referring to FIG. 3, each fastener 20 is configured like a clamp for clipping the base plate 12 and the printed circuit board 30 together and comprises a first latching member 22, a second latching member 24 rotatably connected with the first latching member 22 and an operating member 26 rotatably connected with the first latching member 22 to force the first and second latching members 22, 24 to rotate toward each other and securely clip the base plate 12 and the printed circuit board 30 together.

The first latching member 22 comprises a first holding part 222, a connecting part 224 extending downwardly from an end of the first holding part 222 and two parallel holding arms 221 extending horizontally and outwardly from the end of the first holding part 222. The first holding part 222 is elongated and spans over the base plate 12 of the heat sink 10. An elongated recessing part 2220 is defined in a top of the first holding part 222 along a longitudinal direction, for receiving an end of the operating member 26 therein. The two holding arms 221 are separated from each other and respectively extend forwards from two opposite side walls of the first holding part 222. Two first rotating holes 2210 in alignment with each other are respectively defined in the two holding arms 221 and located adjacent to free ends of the holding arms 221, for receiving a pivot 100 therein to rotatably connecting the operating member 26 and the first latching member 22 together.

The connecting part 224 is made a material with a high strength such as a steel sheet and has an elongated strip configuration. The connecting part 224 extends downwardly from the end of the first holding part 222 and slightly leans outwardly toward the two holding arms 221. The connecting part 224 is located between the two holding arms 221 and corresponding to a joint between the holding arms 221 and the first holding part 222. A lower end of the connecting part 224 is curved forwardly, upwardly and then backwardly to form an engaging tube 2242. A second rotating hole 2240 is defined in the engaging tube 2242 and receives another pivot 100 therein to rotatably connect the first and second latching members 22, 24 together.

The second holding member 24 comprises a second holding part 242 pressing on a bottom of the printed circuit board 30 and an engaging part at an end of the second holding part 242. The engaging part is preferred to be two engaging plates 244 parallel to and separated from each other. The two engaging plates 244 extend upwardly and perpendicularly from two opposite side edges of the end of the second holding part 242. An ear-shape restricting recession 243 is defined in a top of each engaging plate 244 and opens upwardly. The two restricting recessions 243 of the two engaging plates 244 have the same configuration, are in the same level and alignment with each other. Each engaging plate 244 has a curved portion (not labeled) defining a bottom of a restricting recession 243. The curved portion comprises a locking section 2432 at an end thereof adjacent to an outer side of the engaging plate 244 and a releasing section 2434 extending from a middle part to another opposite end thereof. The locking section 2432 is in a higher level than the releasing section 2434 for lifting the operating member 26. Two second rotating holes 2440 in alignment with each other are respectively defined in the two engaging plates 244 and adjacent to the second holding part 242 for engagingly receiving two opposite ends of the another pivot 100 in the engaging tube 2242 of the first latching member 22 therein.

The operating member 26 comprises a handle 262, a pressing part 264 and a pivoting part 266 connecting the handle 262 and the pressing part 264 together. The handle 262 is at an obtuse angle to the pressing part 264, whereby the operating member 26 is substantially V-shape and humps outwardly at the pivoting part 266. The pressing part 264 is quite shorter than the handle 262. Two pressing posts 2640 extend outwardly and perpendicularly from two opposite sides of a distal bottom end of the pressing part 264. A first rotating hole 2660 is defined in the pivoting part 266 and extends from one side to the opposite side of the operating member 26.

In assembly of each fastener 20, the pivoting part 266 of the operating member 26 is located between the two holding arms 221 of the first latching member 22. The pivot 100 is engagingly received in the two first rotating holes 2210 of the holding arms 221 and simultaneously extended through the corresponding first rotating hole 2660 of the pivoting part 266 of the operating member 26 to thus rotatably connect the operating member 26 to the first latching member 22 together. The operating member 26 is rotatable in respect to the pivot 100 fixed to the holding arms 221. The pressing part 264 is located between two upper ends of the two engaging plates 244 with the two pressing posts 2640 thereof received in the two corresponding restricting recessions 243 of the two engaging plates 244. The connecting member 224 of the first latching member 22 is located between the two engaging plates 244 of the second latching member 24. The another pivot 100 is engagingly received in the two second rotating holes 2440 of the engaging plates 244 and simultaneously extended through the corresponding second rotating hole 2240 of the engaging tube 2242 of the connecting part 224 to thus rotatably connect the first and second latching members 22, 24 together.

Figure 4:
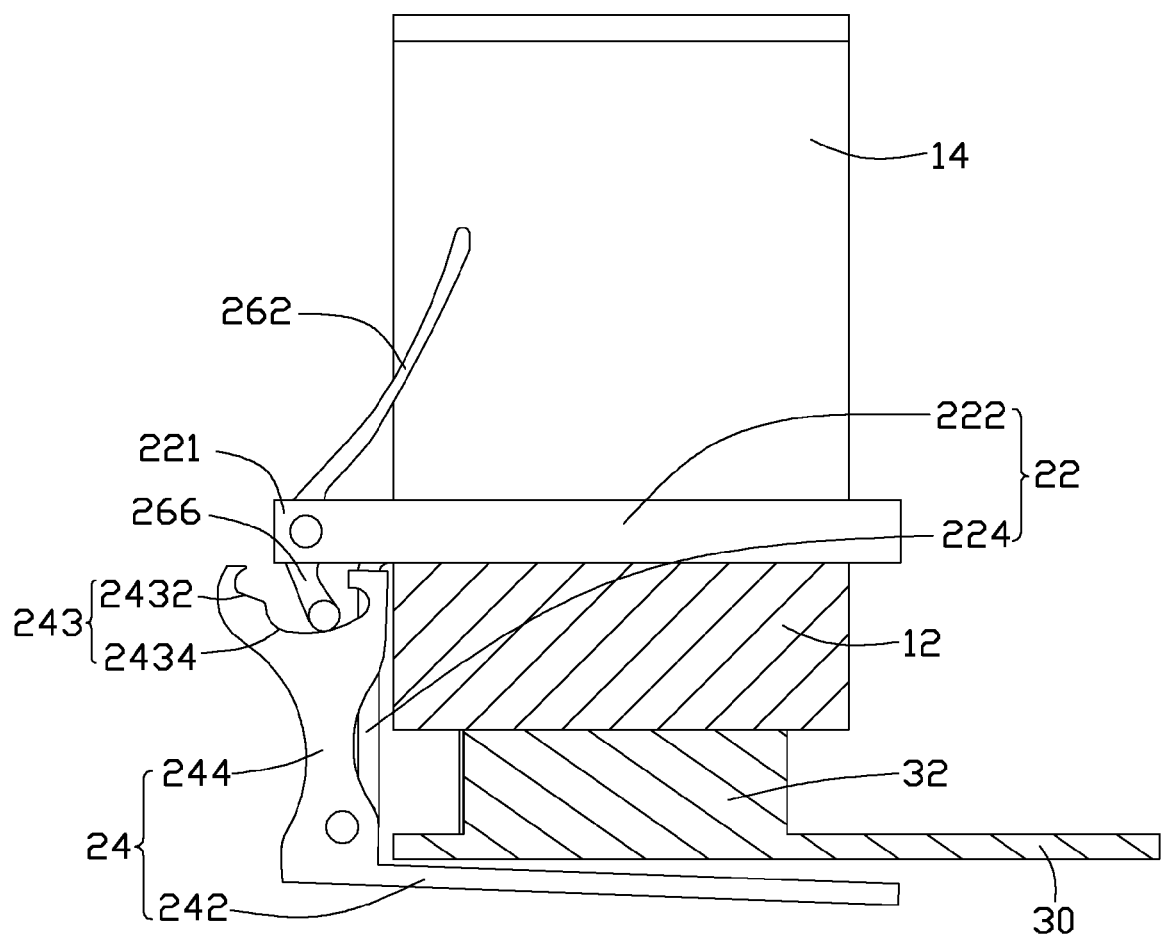
FIG. 4 is a cross-sectional view of the heat dissipation device of FIG. 1 pre-assembled to the printed circuit board.

Also referring to FIG. 4, to secure the heat sink 10 onto the printed circuit board 30, the handles 262 of the operating members 26 are firstly lifted up to place the pressing posts 2640 of the pressing parts 264 onto the releasing sections 2434 of the curved portions at the bottoms of the restricting recessions 243 of the second latching members 24 to thus turn the fasteners 30 into a releasing state. The two fasteners 20 are then moved to make the first holding parts 222 of the first latching members 22 to be inserted into the corresponding receiving channels 16 of the heat sink 10 and the second holding parts 242 of the second latching members 24 engage the bottom of the printed circuit board 30. In the unlocking state of the fasteners 20, the heat sink 10 and the printed circuit board 30 are thus loosely sandwiched between the first and second holding parts 222, 242 of the fasteners 20, and the engaging plates 244 of the second latching members 24 and the connecting parts 224 of the first latching members 22 are located at the same lateral side of the heat sink 10 and the printed circuit board 30.

Figure 5:
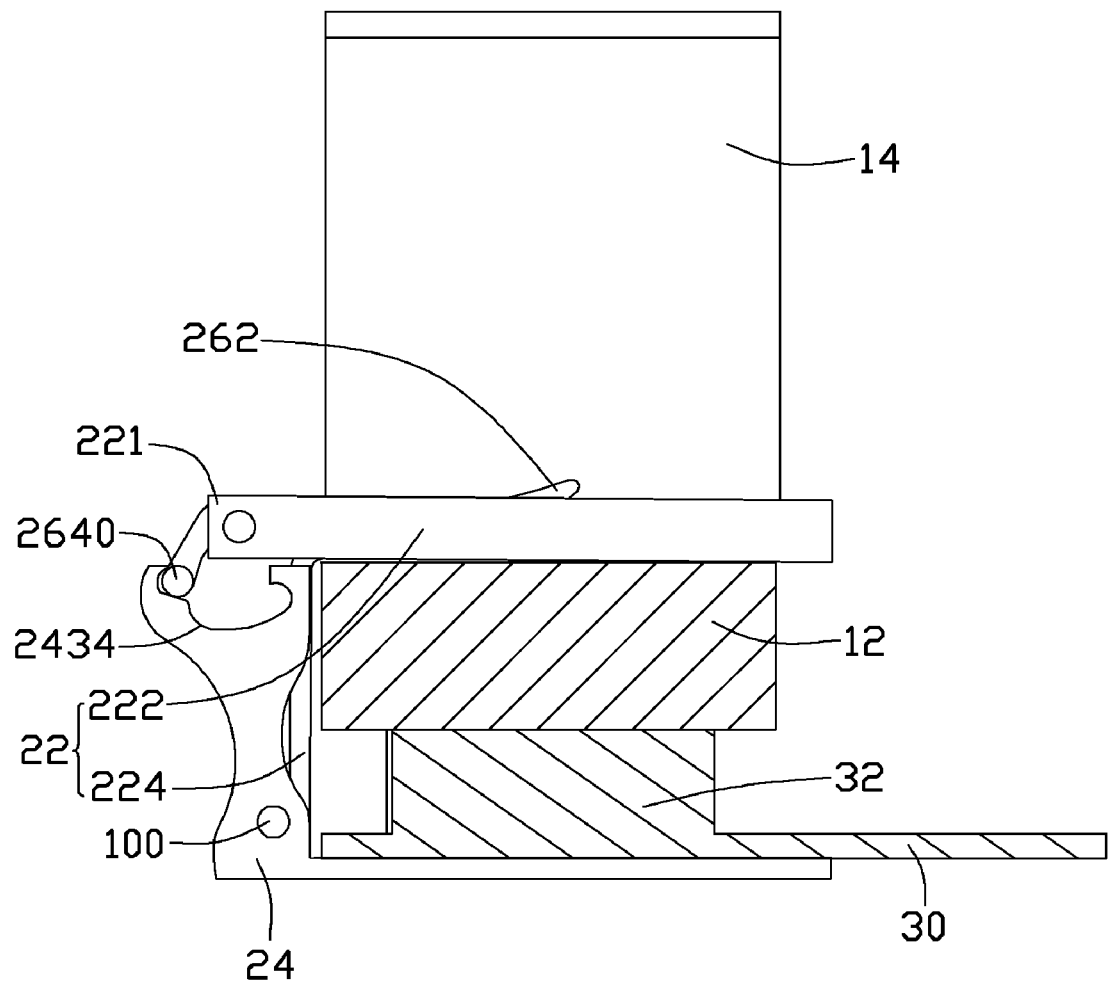
FIG. 5 is a cross-sectional view of the heat dissipation device of FIG. 1 assembled to the printed circuit board.

Referring to FIG. 5, the handles 262 of the operating members 26 of the fasteners 20 are pressed towards the heat sink 10 to turn the fasteners 20 into a locking state. In the locking state of the fasteners 20, the handles 262 of the operating members 26 are rested in the recessing parts 2220 of the first holding parts 222; the pressing posts 2640 of the pressing parts 264 are moved from the releasing sections 2434 to be rested on the locking sections 2432 of the curved portions at the bottoms of the restricting recessions 243 of the second latching members 24. As the locking sections 2432 are in a higher level than the releasing sections 2434 of the curved portions at the bottoms of the restricting recessions 243 of the second latching members 24, the holding arms 221 of the first latching members 22 are lifted by the operating members 26 to force the first and second holding parts 222, 242 to rotate towards each other to closely clip the heat sink 10 and the printed circuit board 30 together when the pressing posts 2640 of the pressing parts 264 are moved from the releasing sections 2434 to the locking sections 2432 of the curved portions at the bottoms of the restricting recessions 243 of the second latching members 24. The second holding parts 242 are rotated in respect to the pivots 100 in the second rotating holes 2440, 2240. The first holding parts 222 are rotated in respect to the pivots 100 in the first rotating holes 2210, 2660.

Therefore, an assembly of the heat sink 10 onto the electronic components 32 mounted on the printed circuit board 30 can be easily completed by placing the heat sink 10 and the fasteners 20 in the unlocking state in position and then pressing the handles 262 of the operating members 26 downwardly to turn the fasteners 20 from the unlocking state into the locking state. In the locking state of the fasteners 20, the first holding parts 222 of the first latching members 22 are respectively received in the receiving channels 16 of the heat sink 10 and press the base plate 12 toward the electronic components 32, while the second holding parts 242 of the second d latching members 24 are rested on the bottom of the printed circuit board 30 and urge the printed circuit board 30 upwardly toward the heat sink 10.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device removing heat from an electronic component mounted on a printed circuit board, the heat dissipation device comprising:
   a heat sink having a bottom in contact with the electronic component; and
   a plurality of fasteners each comprising a first latching member, a second latching member rotatably connected to the first latching member and an operating member rotatably connected to the first latching member and having a pressing part abutting against a curved portion of the second latching member;
   wherein the heat sink and the printed circuit board are located between the first and second latching members of each fastener, and when the operating member is rotated from an unlocking position to a locking position, the first and the second latching members are forced to rotate toward each other to closely clip the heat sink and printed circuit board together.

2. The heat dissipation device as claimed in claim 1, wherein the second latching member comprises a second holding part engaging a bottom of the printed circuit board and an engaging part extending upwardly from an end of the second holding part at a lateral side of the heat sink and the printed circuit board.

3. The heat dissipation device as claimed in claim 2, wherein the first latching part comprises a first holding part rested on the heat sink, two separated holding arms extending outwardly from an end of the first holding part to the lateral side of the heat sink and a connecting part extending downwardly from the end of the first holding part and having a lower end rotatably connected to the engaging part of the second latching member.

4. The heat dissipation device as claimed in claim 3, wherein the connecting part is located at the lateral side of the heat sink and the printed circuit board and extends downwardly and slightly outwardly from the end of the first holding part.

5. The heat dissipation device as claimed in claim 3, wherein the operating member comprises a handle and a pivoting part connecting the handle and the pressing part together, the pivoting part being rotatably located between and connected to the holding arms of the first latching part, a distal end of the pressing part pressing on the curved portion formed on a top of the engaging part to urge the first and second holding parts to rotate toward each other when the operating member is rotated from the unlocking position to the locking position.

6. The heat dissipation device as claimed in claim 5, wherein the engaging part of the second latching member comprises two separated engaging plates, the connecting part of the first latching member being located between the two engaging plates.

7. The heat dissipation device as claimed in claim 6, wherein a lower end of the connecting part is curved forwardly, upwardly and finally backwards to form an engaging tube, a pivot being extended through the engaging plates and received in the engaging tube to rotatably connect the first and second latching members together.

8. The heat dissipation device as claimed in claim 6, wherein the pressing part of the operating member has a middle portion located between the two engaging plates and two pressing posts extending laterally from the middle portion and pressing on tops of the engaging plates, the curved portion being defined in the tops of the engaging plates.

9. The heat dissipation device as claimed in claim 8, wherein a restricting recession defined in the top of each engaging plate, and the curved portion is at a bottom of the restricting recession and comprises a locking section at an end thereof adjacent to an outer side of the engaging plate and a releasing section extending from a middle part to another opposite end thereof, the pressing posts of the operating member being respectively rested on the curved portions at the bottoms of the restricting recessions.

10. The heat dissipation device as claimed in claim 9, wherein the locking section is in a higher level than the releasing section, and when the operating member is rotated from the unlocking position to the locking position by rotating the handle downwardly, the operating member is lifted from the releasing section to the locking section, and the holding arms of the first latching member are lifted to force the first and second holding parts of the each fastener to rotate toward each other.

11. The heat dissipation device as claimed in claim 10, wherein a recessing part is defined in a top of the first holding part of the first latching member and receives the handle of the operating member therein when the handle is rotated downwardly.

12. The heat dissipation device as claimed in claim 10, wherein the handle is longer than the pressing part in length and at an obtuse angle is defined between the handle and the pressing part to make the operating member hump outwardly at the pivoting part.

13. The heat dissipation device as claimed in claim 10, wherein the heat sink comprises a base plate and a plurality of fins extending upwardly from a top of the heat sink, the first holding part of the first latching member being located between neighboring fins and rested on a top of the base plate.

14. The heat dissipation device as claimed in claim 10, wherein a portion of the base plate where the first holding part is rested has a thickness larger than that of other parts of the base plate.

* * * * *